United States Patent [19]
Abbott et al.

[11] Patent Number: 5,429,992
[45] Date of Patent: Jul. 4, 1995

[54] LEAD FRAME STRUCTURE FOR IC DEVICES WITH STRENGTHENED ENCAPSULATION ADHESION

[75] Inventors: Donald C. Abbott, Norton, Mass.; Raymond A. Frechette, North Providence, R.I.

[73] Assignee: Texas Instruments Incorporated, Dallas, Tex.

[21] Appl. No.: 248,800

[22] Filed: May 25, 1994

[51] Int. Cl.⁶ .......................................... H01L 21/60
[52] U.S. Cl. ..................... 437/206; 437/209; 437/211; 437/214; 437/219; 437/220
[58] Field of Search ............... 437/206, 209, 211, 214, 437/217, 218, 219, 220

[56] References Cited

U.S. PATENT DOCUMENTS

| | | | |
|---|---|---|---|
| 4,258,381 | 3/1981 | Inaba | 437/220 |
| 4,445,271 | 5/1984 | Grabbe | 437/220 |
| 4,868,635 | 9/1989 | Frechette et al. | |
| 5,021,864 | 6/1991 | Kelly et al. | 437/220 |
| 5,096,853 | 3/1992 | Yasunaga et al. | 437/217 |
| 5,164,815 | 11/1992 | Lim | 259/666 |
| 5,196,268 | 3/1993 | Fritz | |
| 5,204,287 | 4/1993 | McLellan et al. | |
| 5,227,661 | 7/1993 | Heinen | 257/666 |
| 5,249,354 | 10/1993 | Richman | 437/220 |
| 5,256,598 | 10/1993 | Farnworth et al. | 437/217 |
| 5,327,008 | 7/1994 | Djennas et al. | 257/676 |

Primary Examiner—Kevin M. Picardat
Attorney, Agent, or Firm—Robby T. Holland; Wade James Brady, II; Richard L. Donaldson

[57] ABSTRACT

This invention relates to lead frames upon which chips (A or B) are mounted prior to encapsulation during IC device packaging. A lead frame structure (6) for manufacturing an IC device comprises a lead frame base (1) including a plurality of leads (10) and four first tie bar portions (16) extending toward a die pad aperture (17). A die pad (2) forms a cross-shaped mounting surface (20) for receiving a chip (30), wherein the mounting surface (20) is smaller than the chip (30), such that perimeter surfaces of the chip (30) are substantially exposed when the chip (30) is mounted on the mounting surface (20). Four second tie bar portions (21) extend from the mounting surface (20) and correspond to the four first tie bar portions (16). The die pad (2) is affixed to the lead frame base (1) and positioned in the aperture (17) by affixing each of the first tie bar portions (16) to a corresponding one of the second tie bar portions (21).

7 Claims, 6 Drawing Sheets

LEAD FRAME STRUCTURE FOR IC DEVICES WITH STRENGTHENED ENCAPSULATION ADHESION

FIELD OF THE INVENTION

This invention relates generally to packaging of integrated circuit (IC) devices and more particularly, to lead frames upon which chips are mounted and a method of manufacturing such lead frames.

BACKGROUND OF THE INVENTION

Most IC devices are assembled using a lead frame. Lead frames may be manufactured in long strips of many individual units. The long strips may be wide enough to accommodate from one to more than five lead frames. When a strip is more than one lead frame wide, the strip is referred to as a matrix. A lead frame may be equipped with carrier rails and guide holes to position the lead flames during manufacture. Each lead frame may be comprised of a plurality of leads having internal and external leads, tie bars, and a die pad. The die pad is centrally located on the lead frame and provides a surface on which a chip may be mounted. Lead flames are commonly of various sizes dependent upon the size of the chip, e.g., the semiconductor chip, and the number of connections that are made to the chip.

Conventional lead frame plating processes produce lead flames with clean, non-reactive finishes. The die pad of such lead frames is downset during packaging and a chip is mounted to the die pad. Connection areas on the chip, e.g., bond pads, are connected to the lead frame's internal leads by wire bonds. The die pad, chip, leads, and associated connections are encapsulated in an encapsulating material, e.g., a plastic mold compound, and excess lead frame material, such as the carrier rails, may then be trimmed away.

The leads are spaced around and connected to the chip by bond wires. Moreover, because of the many sizes of chips, there are currently many different sizes and configurations of lead frames, such as quad flat pack or dual-in-line configurations. Each of these lead flames is manufactured separately by lead frame suppliers and IC device manufacturers. Complicated lead frames configurations may be made by expensive stamping tools and dies or by chemical etching. Further, preparation of stamping equipment or etching processes for manufacturing lead frames may result in increased lead frame costs and extended cycle time from demand through development to production. These costs and delays may be reincurred with each new lead frame design.

A source of failure in IC device packages is the delamination of the encapsulating material from the lead frame. This may result from various causes including improper curing of the encapsulating material, surface contamination of the lead frame, and "popcorn failure." Popcorn failure may occur when liquids, such as water, are trapped between the encapsulating material and the die pad or when liquids seep or vapors condense under the encapsulating material. Moreover, plastic mold compounds are naturally capable of absorbing liquids from their environment until saturation occurs. Such liquids may be vaporized during IC device operation, and the expanding vapor, e.g., steam, may cause pressure to build up between the plastic mold compound and the die pad. This pressure build up may cause a catastrophic molded package failure in the form of a crack or delamination.

Encapsulating material failures may also result from thermal mismatch between dissimilar device materials, such as between the lead frame and the encapsulating material, at solder reflow temperatures, e.g., temperatures in a range of about 419° to 464° F. (215° to 240° C.). Such mismatches may be aggravated by the pressure created by the heating of liquids absorbed by the plastic mold compound. The combined effect of these stresses degrades adhesion, leads to delamination—especially between the lead frame and the encapsulating material, and may cause encapsulation cracking or failure.

Efforts to resolve these problems have involved choosing and developing encapsulating materials that better adhere to the chip or the die pad, or both. Encapsulating materials that are lower stress, stronger, absorb less moisture, and possess better adhesion capabilities have been proposed. Nevertheless, these have not eliminated the problems. Further, because specialized encapsulating materials are generally more expensive, their use tends to increase the costs of manufacturing. Further, additional process steps, such as dry packing of the finished device to reduce exposure to contaminating liquids, such as water, or texture etching of the die pad, have been added to manufacturing processes. Nevertheless, these also have increased lead frame manufacturing costs.

SUMMARY OF THE INVENTION

Accordingly, a need has arisen for a lead frame structure that may be readily and inexpensively modified to accept a plurality of different chips. A need has also arisen for a method by which the components of such versatile lead frame structures may be made and assembled economically at commercial rates. In accordance with the present invention, the lead frame structure includes a lead frame base having an outer lead frame and an inner lead frame and a die pad, such that when the lead frame base and the die pad are affixed to each other, the lead frame structure performs functions of present lead frame designs.

Further, a need has arisen for a lead frame structure that can be readily and inexpensively modified to accept a plurality of different die pads. In accordance with the present invention, the lead frame structure includes a die pad which permits greater direct contact between the chip, especially at the chip's perimeter surfaces, and an encapsulating material.

An embodiment of the present invention is a lead frame structure for manufacturing an IC device. The lead frame structure comprises a lead frame base which includes a plurality of leads and has a die pad aperture. The lead frame base may further comprise an outer and an inner lead frame. The lead frame base has at least one first tie bar portion which extends toward the aperture. A die pad forms a mounting surface for receiving at least one chip. The mounting surface is smaller than the at least one chip, such that perimeter surfaces of the at least one chip are substantially exposed when the at least one chip is mounted on the mounting surface, and the die pad includes at least one second tie bar portion which extends from the mounting surface and corresponds to the at least one first tie bar portion. The die pad is affixed to the lead frame base, and the mounting surface is positioned in the aperture by affixing the at least one first tie bar portion to the corresponding at least one second tie bar portion. Thus, the geometry of the mounting pad, for example, cross-shaped, is such that when the at least one chip is mounted on the mounting surface and the lead frame base, the die pad, and the at least one chip are encapsulated in an encapsulating material, perimeter surfaces of the at least one chip are in direct contact with the encapsulating material.

In another embodiment, the invention is a method of manufacturing an IC device. The method comprises the step of forming a lead frame base which includes a plurality of leads and has a die pad aperture defined by the leads. The lead frame base also has at least one first tie bar portion which extends toward the aperture. The method also includes the step of forming a die pad having a mounting surface for receiving at least one chip. As discussed above, the mounting surface is smaller than the at least one chip, such that perimeter surfaces of the at least one chip are substantially exposed when the at least one chip is mounted on the mounting surface. The die pad includes at least one second tie bar portion which extends from the mounting surface and corresponds to the at least one first tie bar portion. Further, the method includes the step of affixing the at least one tie bar portion to the corresponding at least one tie bar portion and positioning the mounting surface in the aperture.

The present invention provides various technical advantages over known lead frames and lead frame manufacturing methods. A technical advantage of this invention is that the making the lead frame base and die pad separately allows the IC device manufacturer more design flexibility. For example, the encapsulating material or the die pad may be chosen with a thermal expansion coefficient which is about equal to or more closely matches that of the chip to reduce the likelihood of IC device package failure caused by differing rates or degrees of expansion. Another technical advantage is that because of the design flexibility of this lead frame structure, the cycle time for bringing new IC devices to market may be shortened. Still another technical advantage is that the lead frame base and die pad may be produced using a generic etching process or stamp and then tailored or "customized" to accommodate a variety of chips or chip bond pad configurations. Yet another technical advantage is that the outer lead frames may be readily adjusted by shortening the internal lead fingers to enlarge the die pad aperture to accommodate a variety of chip sizes. Alternatively, because the die pad is smaller than the chip, the die paid may also be smaller than the die pad aperture, thereby permitting the internal lead to converge into the die pad aperture permitting a single lead frame design to accommodate small chips.

Other technical advantages are readily apparent to one skilled in the art from the drawings, descriptions, and claims.

BRIEF DESCRIPTION OF THE DRAWINGS

For a more complete understanding of the present invention and the technical advantages thereof, reference is made to the following description taken in conjunction with accompanying drawings in which.

DETAILED DESCRIPTION OF THE INVENTION

Figure 1:
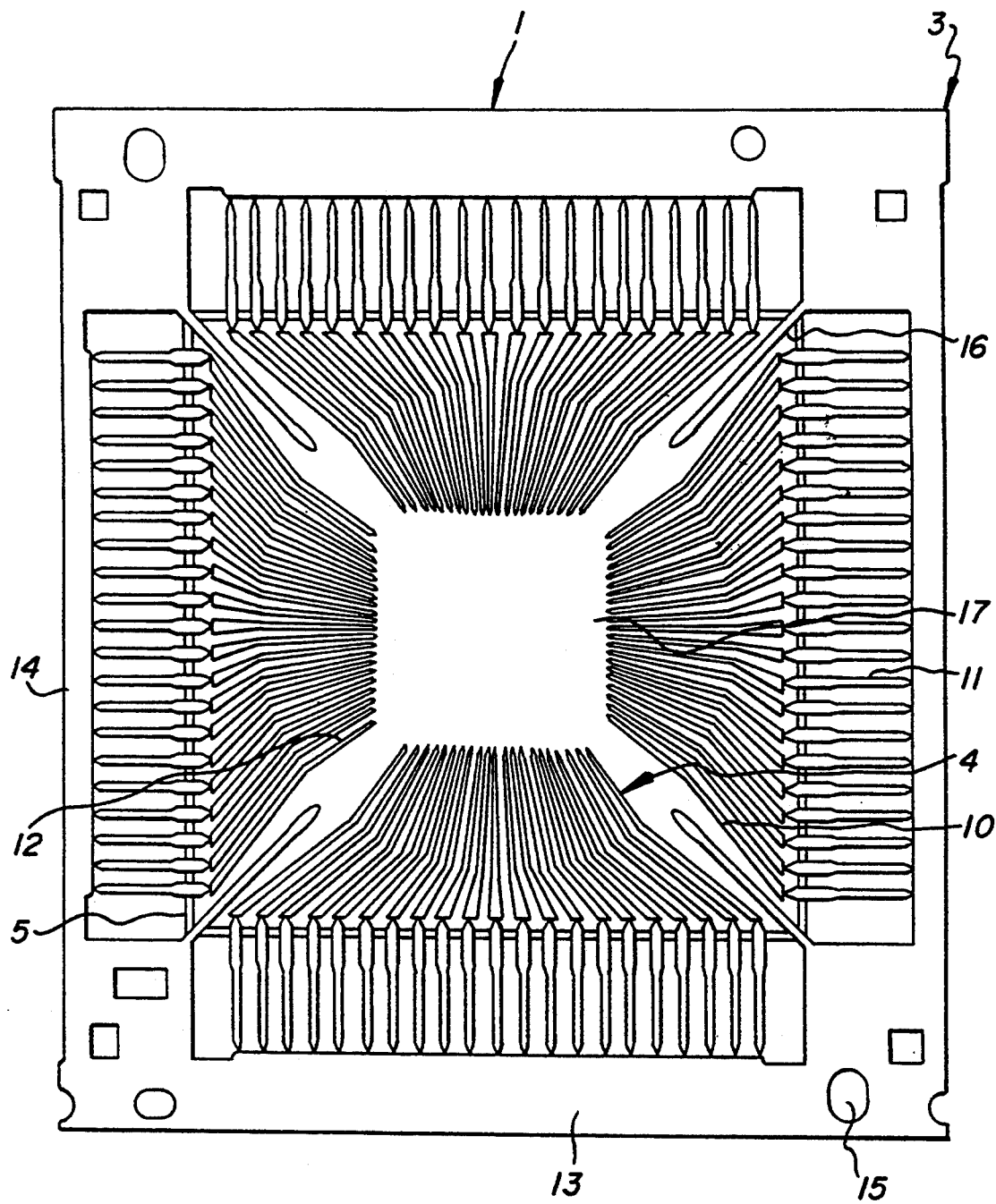
FIG. 1 depicts an overhead view of lead frame base with attached carrier rails.

Referring to FIG. 1, an overhead view of a lead frame base 1 with attached carrier rails 13 is depicted. Lead frame 1 comprises an outer lead frame 3 separated from an inner lead frame 4 by a dam bar 5. Lead frame base 1 includes a plurality of leads 10 each having external leads 11 and internal leads 12 and four tie bar portions 16 which extend from carrier rails 13 toward a die pad aperture 17. Leads 10 may be stamped or etched from a sheet of lead frame material which is sufficiently ductile to allow the formation of external leads 11 and internal leads 12. Suitable lead frame materials include copper, iron, nickel, aluminum, or alloys containing these metals, such as Alloy 42. Alloy 42 is a nickel/iron alloy containing about 42% nickel and about 58% iron. Leads 10 may also be plated, selectively or by flood plating techniques, with highly conductive metals, such as silver, copper, gold, or palladium. Leads 10 are surrounded by a support structure 5 including separating strips 14 and carrier rails 13 having guide holes 15.

Carrier rails 13 and guide holes 15 are used to position lead frame material through the stamping or etching process and plating processes. A stamping process involves making an lead frame base die or generic tool and mounting it on a high speed stamping apparatus. The stamping apparatus may then produce copies of a generic lead frame base pattern. Alternatively, lead frame base 1 may be produced by an etching process. Although initial setup costs for an etching process are lower than the initial tooling costs for a stamping process, an etching process involves the use and replenishment of etching materials and chemicals, such as photoresists. Further, an etching process currently does not produce lead frames as rapidly as a stamping process, and as production volume demand increases, stamped lead frames may be more cost efficient than etched lead frames. Nevertheless, either process may be used with reel-to-reel or batch plating processes.

Leads 10 are arrayed on four sides of and define the size and shape of die pad aperture 17. Lead frame base 1 is configured for use with a quad flat pack IC device. However, leads 10 may be arrayed for use in dual-in-line and other IC device configurations. Aperture 17 also may be oversized to accommodate a plurality of chip sizes. An IC device manufacturer may compensate for the difference between the small size of a chip (not shown) and the relatively large size of aperture 17 by adjusting the length of the wire bonds (not shown) extending between a chip's bond pads (not shown) and internal leads 12.

Figure 2A:
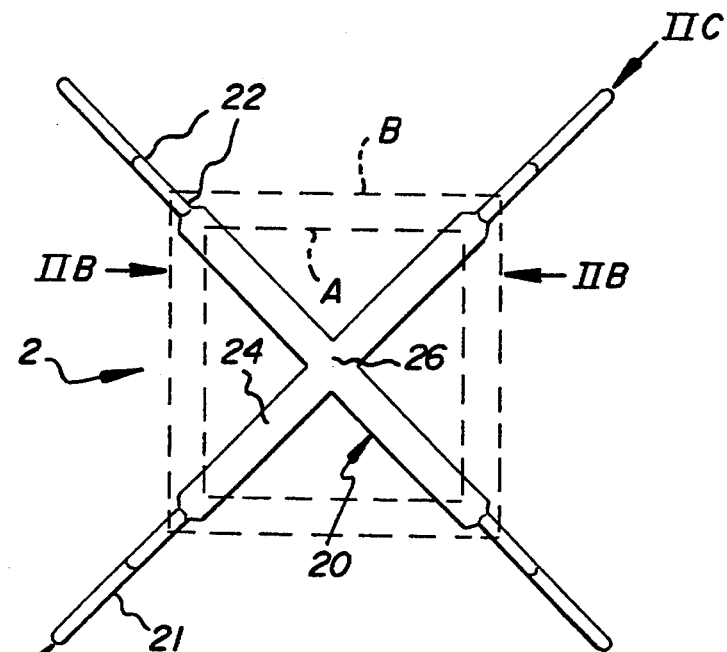
FIG. 2a depicts an overhead view of a die pad forming a cross-shaped mounting surface for receiving a chip A or B.

Referring to FIG. 2a, an overhead view of a die pad 2 is depicted which forms a cross-shaped mounting surface 20 for a chip A or B. In this configuration, mounting surface 20 is substantially cross-shaped having four arms 24 joined at center 26 and partially fills aperture 17 depicted in FIG. 1. In addition to mounting surface 20, die pad 2 includes four tie bar portions 21 which extend from mounting surface 20. Die pad 2 is downset to receive a chip A, and each of the tie bar portions 21 may be bent at bend points 22.

Figure 2B:
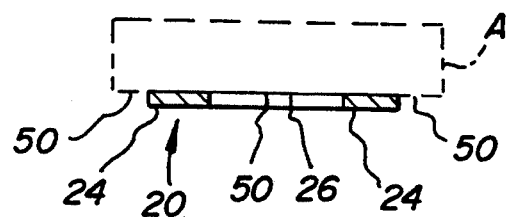
FIG. 2b depicts a cross-sectional view of the die pad of FIG. 2a, along line IIB—IIB, and chip A.

The location and angle of bend points 22 is determined by the size and height of the chip A or B mounted on mounting surface 20. Referring to FIG. 2b, a cross-sectional view of die pad 2 of FIG. 2a is depicted along line IIB—IIB. Because cross-shaped mounting surface 20 of die pad 2 is smaller than chip A, perimeter surfaces 50 are exposed when chip A is mounted on mounting surface 20. In the embodiment depicted in FIG. 2b, perimeter surfaces 50 are substantially triangular in shape and are defined by arms 24 of mounting surface 20 which join at center 26 and the edges of chip A.

Figure 2C:
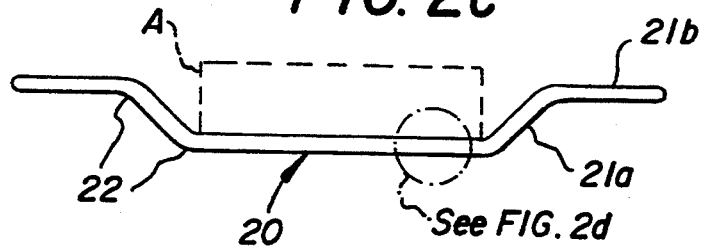
FIG. 2c depicts a cross-sectional view of the die pad of FIG. 2a, along line IIC—IIC, and having chip A.

Generally, if the height of the chip increases, the angle of the bends may increase proportionately. Referring to FIG. 2c, a cross-sectional view of die pad 2 of FIG. 2a, along line IIC—IIC, and having chip A, is depicted. Bends 22 separate tie bar portions 21 into segments 21a and 21b with segment 21b being substantially parallel to mounting surface 20. Die pad 2 may be downset, as depicted in FIG. 2c, by a stamping apparatus. A suitable stamping apparatus is adjustable to downset die pad 2 to accommodate chips of various heights. Further, die pad 2, as depicted in FIG. 2a, is downset to accommodate a chip A which may be contained on cross-shaped mounting surface 20. If a larger chip B is placed on cross-shaped mounting surface 20, bend points 22 may be placed farther from mounting surface 20 to accommodate larger chip B on die pad 2.

Figure 2D:
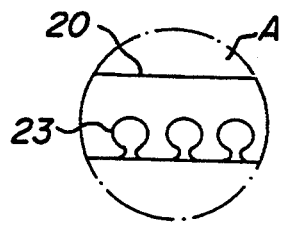
FIG. 2d depicts an enlarged cross-sectional view of a portion of the die pad of FIG. 2c revealing etching features on the bottom side of the mounting surface.

As part of the packaging of IC devices, die pad 2 and chip A or B may be encapsulated in a plastic mold compound. FIG. 2d shows an enlarged cross-sectional view of a portion of cross-shaped mounting surface 20 of FIG. 2c. Mounting surface 20 includes etching features 23, such as a matrix of individual spherical or tear drop-shaped dimples, on the side of cross-shaped mounting surface 20 opposite chip A. Features 23 may also comprise a series of substantially parallel grooves.

Figure 3:
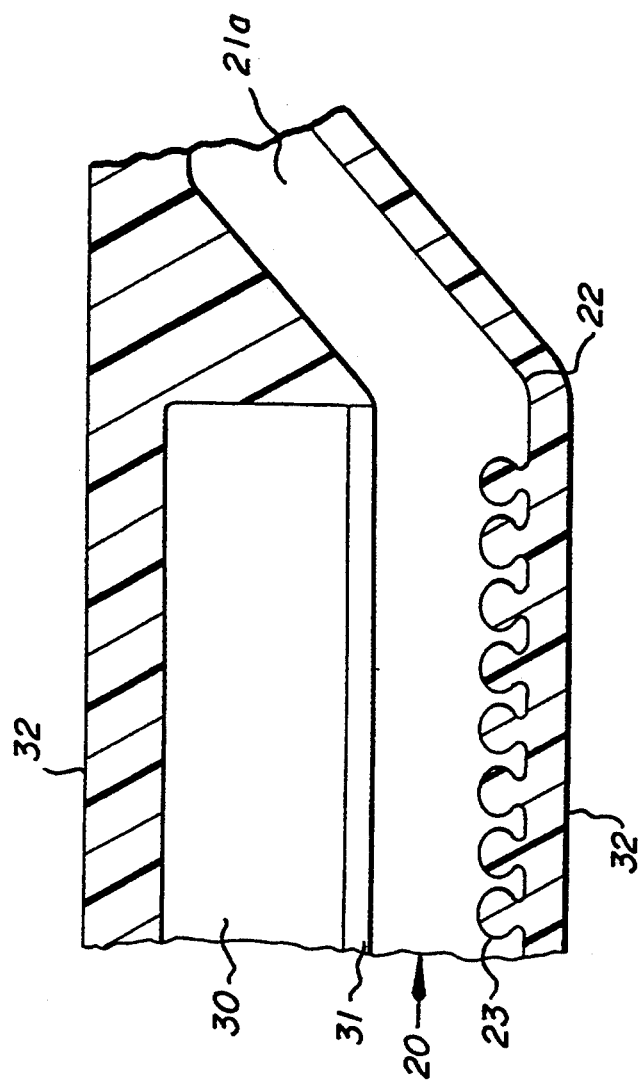
FIG. 3 depicts a partial cross-sectional view of the die pad of FIG. 2c, including a chip epoxied to the mounting surface and a plastic mold compound encapsulating the die pad and the chip and filling the etching features.

Referring to FIG. 3, a partial cross-sectional view of die pad 2 of FIG. 2c is depicted, which includes a chip 30 mounted on cross-shaped mounting surface 20 by a layer of epoxy adhesive 31. Die pad 2, chip 30, and layer of epoxy adhesive 31 are encapsulated in a plastic mold compound 32. Plastic mold compound 32 forms a bond with chip 30. This bond is strengthened by the direct contact between plastic mold compound 32 and chip 30 on perimeter surfaces of chip 30. Plastic mold compound 32 also flows into and cures within etching features 23, thereby strengthening the bond between die pad 2 and plastic mold compound 32. This strengthened bond helps prevent delamination of plastic mold compound 32 from die pad 2 and lessens the danger of catastrophic adhesion failure, e.g., "popcorn failure."

Materials used to make die pad 2 may be similar to those used to make lead frame base 1. Nevertheless, die pad 2 also may be made from dielectric materials; clad metals, which better manage stresses internally or may act as a heat sink; or ceramic composites. A dielectric material is a material which is an insulator. A clad metal is a metal overlaid on one or both sides with a different metal. A ceramic composite includes a material composed of a combination of ceramics with the addition of strengthening agents. Moreover, die pad 2 may be made of a combination of materials. From whatever material die pad 2 is made, a high integrity bond exists between die pad 2 and plastic mold compound 32. Further, whether die pad 2 is a heat dissipator or a heat sink depends upon the specific design of the IC device.

Figure 4A:
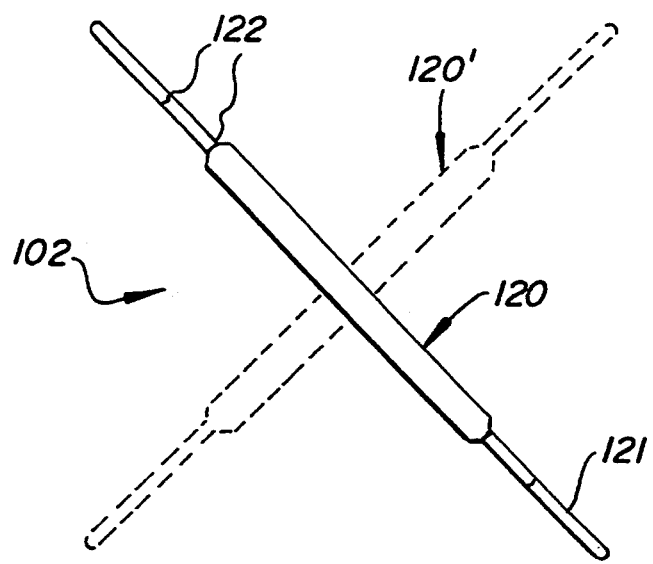
FIG. 4a depicts an overhead view of a die pad forming a panel-shaped mounting surface for receiving a chip.
Figure 4B:
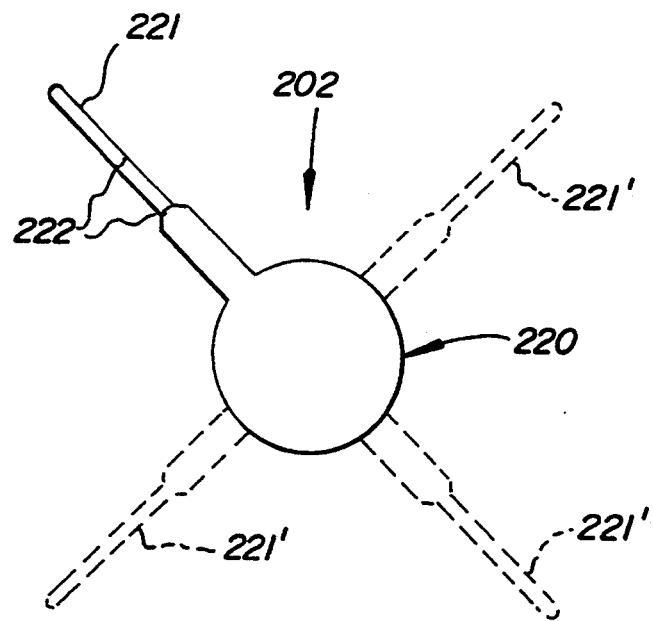
FIG. 4b depicts a die pad forming a circular mounting surface for receiving a chip which has a single second tie bar portion.

FIGS. 4a and 4b depict embodiments of the die pad having other mounting surface geometries. FIG. 4a depicts an overhead view of a die pad 102 including a panel-shaped mounting surface 120. Die pad 102 also includes two second tie bar portions 121. When a chip (not shown) is mounted on mounting surface 120, second tie bar portions 121 may be bent at bend points 122 to downset die pad 102. Alternatively, die pad 102 may comprise two panel-shaped mounting surfaces 120 and 120', which may cross beneath a chip (not shown).

FIG. 4b depicts an overhead view of a die pad 202 including a circular mounting surface 220. Die pad 202 also includes one second tie bar portion 221. When a chip (not shown) is mounted on mounting surface 220, second tie bar portion 221 may be bent at bend points 222 to downset die pad 202. Alternatively, one or more additional second tie bar portions 221' may be added to die pad 202 to more firmly affix die pad 202 to a lead frame base, such as lead frame base 1 depicted in FIG. 1.

Figure 6:
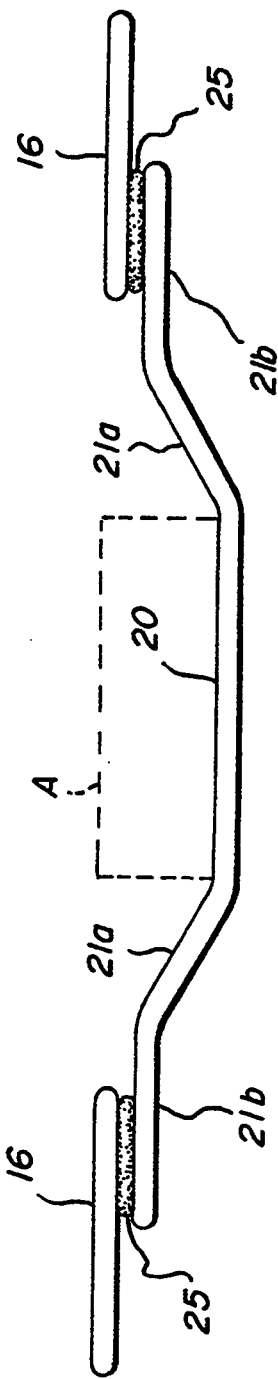
FIG. 6 depicts a cross-sectional view of the lead frame structure of FIG. 5, along line V—V, which shows the die pad of FIG. 2a downset to receive a chip A and affixed by means of adhesive tape to the lead frame base of FIG. 1.
Figure 5:
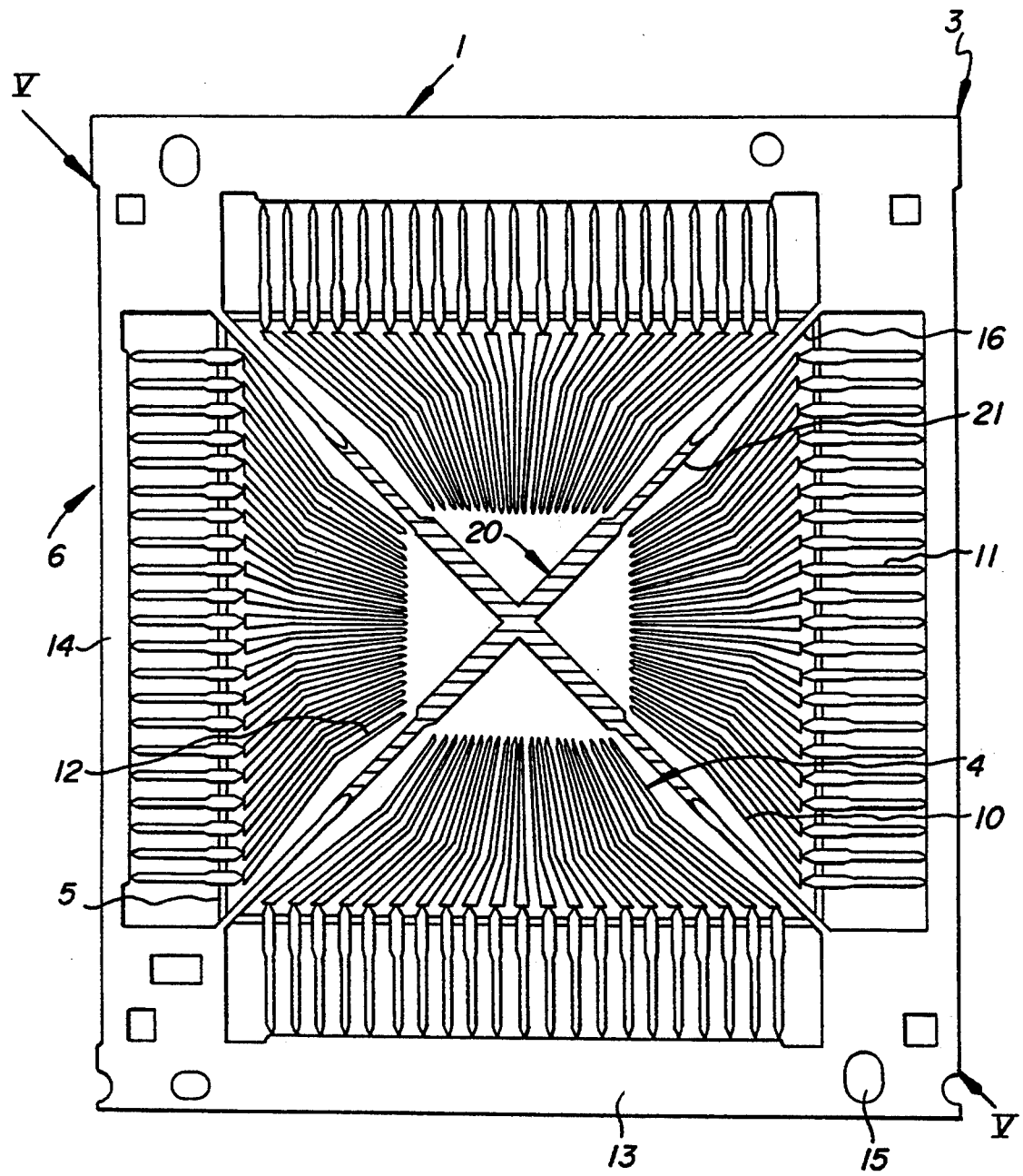
FIG. 5 depicts an overhead view of a lead frame structure wherein the die pad of FIG. 2a is affixed to the lead frame base of FIG. 1.

Referring to FIG. 5, an overhead view of a lead frame structure 6 is depicted. Lead frame structure 6 includes lead frame base 1 of FIG. 1 affixed to die pad 2 of FIG. 2a. Specifically, tie bar portions 16 of lead frame base 1 are affixed to tie bar portions 21 to form lead frame structure 6. FIG. 6 depicts lead frame structure 6 of FIG. 5, along line V—V, and shows tie bar portions 16 and 21, i.e., segment 21b, affixed to each other by taping with adhesive tape 25. Adhesive tape 25 is a low ionic tape to minimize contamination during manufacturing of the IC device, and a suitable tape is Tomoegawa R722 produced by Tomoegawa Company. Alternatively, tie bar portions 16 and 21 may be affixed to each other by adhesive bonding, such as with an acrylic adhesive; by welding; by soldering; by mechanical staking; or the like.

Figure 7:
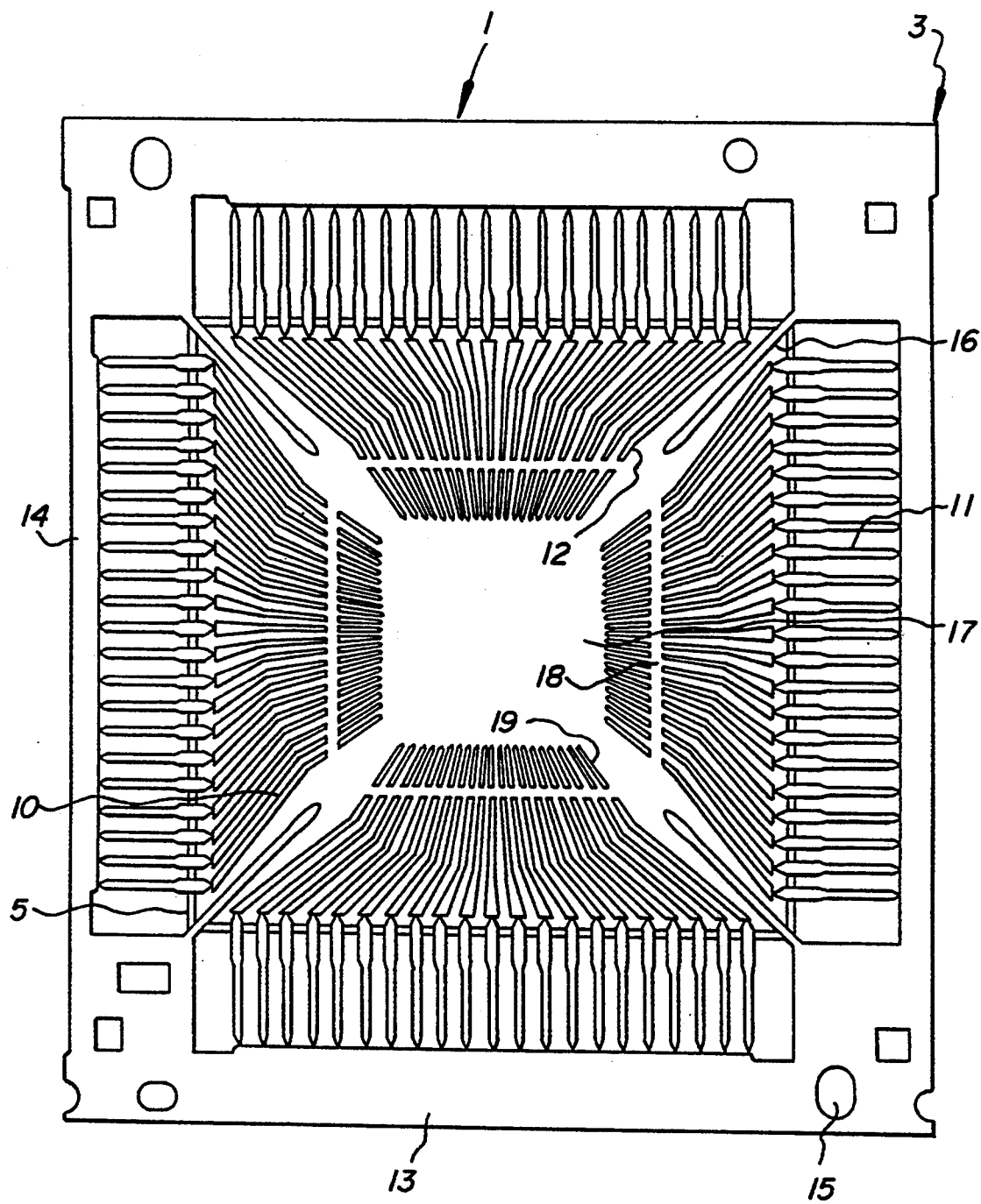
FIG. 7 depicts an overhead view of a lead frame base with the internal lead tips severed to enlarge the die pad aperture.

Referring to FIG. 7, an overhead view of lead frame base 1 is depicted. A plurality of cuts 18 have been made to sever internal lead tips 19. The purpose of cuts 18 is to shorten the length of leads 10 and thereby, to enlarge die pad aperture 17. As depicted in FIG. 2a, chip B is substantially larger than cross-shaped mounting surface 20 of die pad 2. Further, because the die pad is formed separately from the lead frame base, internal leads 12 may converge in aperture 17. By severing internal lead tips 19, aperture 17 may be enlarged to accommodate chip B. Thus, a generic lead frame base may be combined with a generic die pad to manufacture a variety of IC devices having chips of various sizes. Further, because not all leads need be used in every IC device, the pin count or pitch of the IC device may be limited by the total number of leads of the generic lead frame base.

Although a detailed description of the present invention has been provided above, it is to be understood that the scope of the invention is to be determined by the claims that follow.

What is claimed is:

1. A method of manufacturing an IC device, comprising the steps of:
   forming a lead frame base including a plurality of leads, said lead frame base having a die pad aperture defined by said leads, and at least one first tie bar portion which extends toward said aperture;
   forming a die pad having a mounting surface for receiving at least one chip, wherein said mounting surface is smaller than said at least one chip, such that perimeter surfaces of said at least one chip are substantially exposed when said at least one chip is mounted on said mounting surface, and including at least one second tie bar portion which extends from said mounting surface and corresponds to said at least one first tie bar portion; and
   affixing said at least one first tie bar portion to said corresponding at least one second tie bar portion and positioning said mounting surface in said aperture.

2. The method of claim 1, further comprising the step of shortening said leads to enlarge said aperture.

3. The method of claim 1, wherein said mounting surface is cross-shaped, said die pad has four second tie bar portions, and said lead frame base has four first tie bar portions.

4. The method of claim 1, further comprising the steps of:
   downsetting said die pad;
   mounting at least one chip on said mounting surface; and
   encapsulating a portion of said lead frame base and said at least one chip in an encapsulating material, so that said perimeter surfaces of said at least one chip are in direct contact with said encapsulating material.

5. The method of claim 1, further comprising the step of etching at least one side of said mounting surface to form etching features, whereby adhesion between said mounting surface and an encapsulating material is strengthened.

6. The method of claim 1, wherein said step of forming said lead frame base further comprises a step selected from the group of steps consisting of stamping said lead frame base from a sheet of lead frame material and etching said lead frame base from a sheet of lead frame material.

7. The method of claim 1, wherein said step of affixing said at least one first tie bar portion to said corresponding at least one second tie bar portion and positioning said mounting surface in said aperture further comprises a process selected from the group consisting of adhesive taping, adhesive bonding, welding, soldering, and mechanical staking.

* * * * *